(12) United States Patent
Zhu

(10) Patent No.: US 9,952,927 B2
(45) Date of Patent: Apr. 24, 2018

(54) DATA PROTECTION FOR COLD STORAGE SYSTEM

(71) Applicant: Futurewei Technologies, Inc., Plano, TX (US)

(72) Inventor: Xiaogang Zhu, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 122 days.

(21) Appl. No.: 15/007,953

(22) Filed: Jan. 27, 2016

(65) Prior Publication Data

US 2017/0212805 A1    Jul. 27, 2017

(51) Int. Cl.
- *G06F 11/10* (2006.01)
- *G06F 3/06* (2006.01)
- *H03M 13/15* (2006.01)

(52) U.S. Cl.
CPC .......... *G06F 11/1088* (2013.01); *G06F 3/064* (2013.01); *G06F 3/0619* (2013.01); *G06F 3/0653* (2013.01); *G06F 3/0689* (2013.01); *H03M 13/15* (2013.01); *G06F 2211/1004* (2013.01)

(58) Field of Classification Search
CPC ............. G06F 11/1088; G06F 11/1076; G06F 11/7092; G06F 11/1096
USPC ........................................................ 714/6.24
See application file for complete search history.

(56) References Cited

U.S. PATENT DOCUMENTS

| | | |
|---|---|---|
| 5,499,253 A | 3/1996 | Lary |
| 5,805,788 A | 9/1998 | Johnson |
| 5,913,927 A | 6/1999 | Nagaraj et al. |
| 8,341,342 B1 | 9/2012 | Bonwick et al. |
| 8,843,700 B1 | 9/2014 | Salessi et al. |
| 2007/0294565 A1* | 12/2007 | Johnston ............. G06F 11/1076 714/6.12 |

(Continued)

FOREIGN PATENT DOCUMENTS

| | | |
|---|---|---|
| CN | 101976174 A | 2/2011 |
| CN | 102081559 A | 6/2011 |
| WO | 2014111979 A1 | 7/2014 |

OTHER PUBLICATIONS

Machine Translation and Abstract of Chinese Publication No. CN101976174, Feb. 16, 2011, 16 pages.

(Continued)

*Primary Examiner* — Chae M Ko
(74) *Attorney, Agent, or Firm* — Conley Rose, P.C.

(57) ABSTRACT

A data storage apparatus comprising a plurality of data storage devices configured to store data blocks, and one or more protection devices configured to store protection blocks, wherein the data devices and the protection devices are associated by a plurality of stripes, wherein each stripe comprises a memory block on each data device or protection device, and wherein each protection block in a protection device comprises a value for reconstructing storage blocks in the same stripe, and a controller configured to select a data device, store data blocks sequentially to the memory blocks in the selected data devices, store protection blocks in the protection devices for each updated stripe, read data blocks from a selected data device, and reconstruct damaged storage devices. It operates a cold storage system with less power consumption, low component wear, and flexible in capacity expansion.

20 Claims, 6 Drawing Sheets

(56) References Cited

U.S. PATENT DOCUMENTS

| | | | | |
|---|---|---|---|---|
| 2008/0282105 | A1* | 11/2008 | Deenadhayalan | G06F 11/1076 |
| | | | | 714/6.12 |
| 2010/0037022 | A1 | 2/2010 | Chou et al. | |
| 2013/0166945 | A1* | 6/2013 | Nakao | G06F 11/2094 |
| | | | | 714/6.21 |
| 2013/0254589 | A1* | 9/2013 | Sonobe | G06F 11/3034 |
| | | | | 714/6.1 |

OTHER PUBLICATIONS

Machine Translation and Abstract of Chinese Publication No. CN102081559, Jun. 1, 2011, 15 pages.
Foreign Communication From a Counterpart Application, PCT Application No. PCT/CN2017/070864, English Translation of International Search Report dated Apr. 1, 2017, 4 pages.
Balakrishnan, S., et al. "Pelican: A Building Block for Exascale Cold Data Storage", Proceedings of the 11th USENIX Symposium on Operating Systems Design and Implementation, https://www.usenix.org/conference/osdi14/technical-sessions/presentation/balakrishnan, Oct. 6-8, 2014, 16 pages.

* cited by examiner

DATA PROTECTION FOR COLD STORAGE SYSTEM

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Cold storage is a storage paradigm for storing large amounts of data that are rarely access or modified. For example, cold storage data may be employed to store sensor output, camera footage, internet of things (IoT) related data, archived electronic messages, or other archive data. Cold storage operates on the presumption that large amounts of data are to be stored and that most of the data will be accessed/modified rarely or not at all. Cold storage systems are designed to provide large amounts of storage in a space efficient manner. Data access time for cold storage systems should be reasonably low (e.g. less than a minute) while maintaining high data density and minimizing power consumption. Multiple access may also be beneficial for searching the large data volumes. The cold storage system should also be protected from hardware failure and provide efficient mechanisms for hardware replacement and data recovery when hardware components fail.

SUMMARY

In an embodiment, the disclosure includes a data storage apparatus comprising a set of redundant storage arrays, wherein a redundant storage array comprises a plurality of striped storage devices, such as hard disks, or solid-state drives (SSDs), wherein all storage devices of a redundant storage array are associated by a plurality of stripes, wherein each stripe comprises one memory block in each storage device across all devices of the array. All storage devices of a redundant storage array are functionally grouped into two groups: data devices (k storage devices in FIG. 1) and protection devices (R storage devices in FIG. 1). The memory blocks on the data devices are used to store the data blocks to be retrieved later. The memory blocks on the protection devices are used store protection blocks for the purpose of reconstructing up to R damaged blocks within a common stripe, wherein each memory block of a protection device comprises a value based on a certain data protection algorithms, such as Redundant Array of Independent Disks (RAID) 5, RAID 6, Reed-Solomon code, etc. A controller is coupled to a set of redundant storage arrays in a cold storage system, wherein a controller is configured to locate a desired redundant storage array, select a data device in the array, store a set of data blocks sequentially in the selected data device, and update a set of protection blocks in the protection devices for each updated stripe, wherein an updated stripe is the one where at least one memory block is changed when writing storage data blocks to the selected data devices.

In another embodiment, the disclosure includes a method of data storage comprising storing, based on instructions from a controller, data blocks in a plurality of sequential memory blocks in a single selected data device, generating a protection data block for each protection device based on each updated stripe, and storing each generated data block to its corresponding protection device.

In another embodiment, the disclosure includes a non-transitory computer readable medium comprising a computer program product for use by a controller coupled to a set of redundant storage arrays, the computer program product comprising computer executable instructions stored on the non-transitory computer readable medium such that when executed by a processor cause the controller to write storage data blocks in a plurality of sequential memory blocks in a single selected data device in the array, generate a protection data block for each protection device based on each updated stripe, and store each generated protection data block to its corresponding protection devices.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
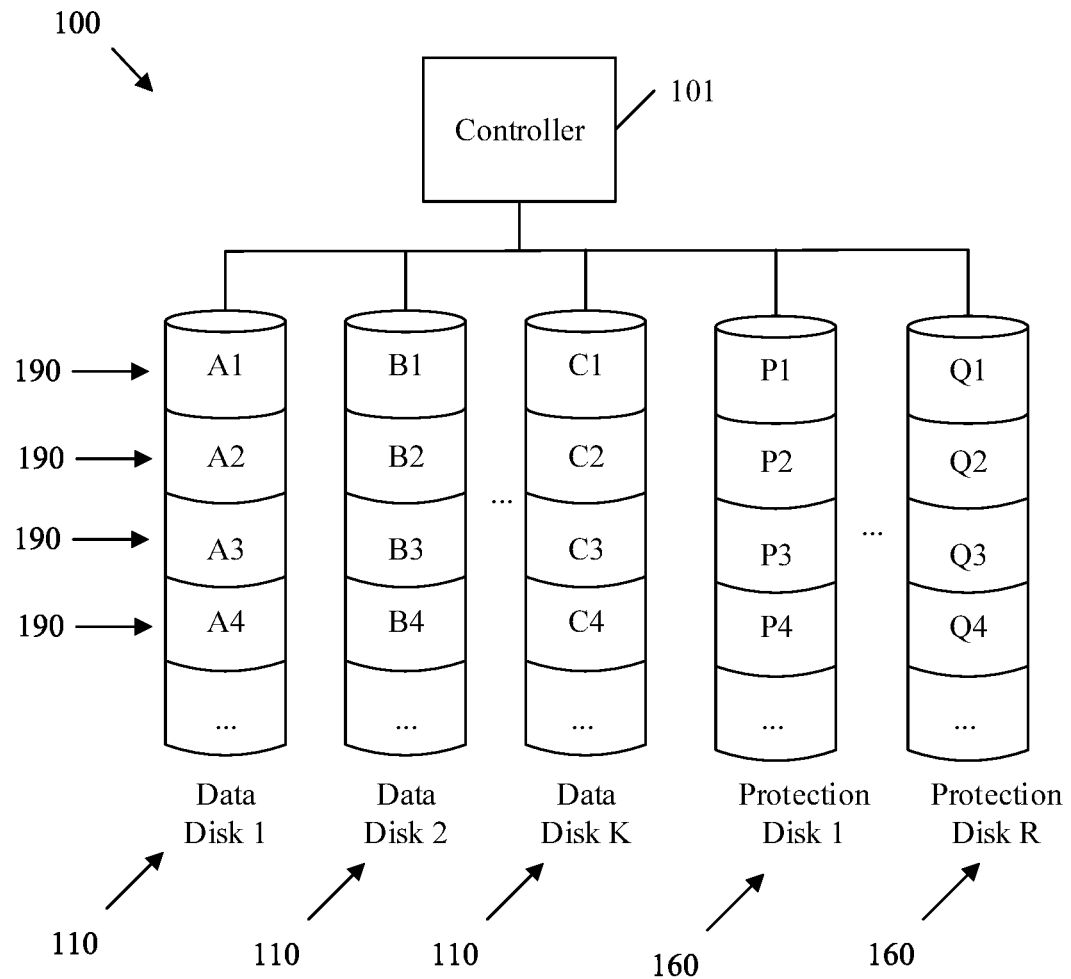
FIG. 1 is a schematic diagram of an embodiment of a redundant storage array based on a cold data storage network.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Redundant Array of Independent Disks (RAID) is a data storage virtualization technology that combines multiple physical disk drives components into a single local unit for the purpose of redundancy, performance improvement, or both. When applying it to a cold storage system, there are some limitations in system power consumption, device wear and tear, and restricted multiple data access capability.

This disclosure provides a data storage apparatus/method/system on cold storage systems for the purpose of data redundancy with less power consumption, low component wear and tear, and improved parallel data access capability.

A RAID system may be employed to store data in a manner that is quickly readable and protected against failure. A RAID system splits data into blocks and writes the data blocks into memory blocks on multiple storage devices, such as hard disk drives (HDDs), solid-state drives (SDDs), or other storage media. Some RAID systems protect data by employing mirroring. In a mirroring system, exact copies of each data block are stored on multiple storage devices so that a copy of the data is always available if one of the mirrored disks fails. Mirroring may not be a space efficient scheme, and hence may not be suitable for cold storage systems. Some RAID systems employ striping. In a striping scheme, sequential data blocks are allocated to a stripe that extends across all available storage devices within the same RAID array. Striping allows for related data to be accessed in parallel by reading/writing to each device simultaneously. Protection blocks may be used to protect the striped data blocks from failure. Protection blocks are calculated based on the other data blocks within the same stripe. If a data block is damaged, for example due to hardware failure, the damaged data block can be reconstructed from the remaining blocks within the stripe based on the protection algorithms. The reconstructed data blocks can then be written to a new device. Multiple protection blocks in each stripe protect the system from multiple device failures. Protection blocks may be distributed evenly across all storage devices. RAID systems employing striping allow for high speed read and write (e.g. fast updates), space efficient storage, and data recovery. However, RAID systems employing striping may not be efficient for cold storage systems. For cold storage systems, fast access time may be less important than reduced power consumption and component wear. For example, any data access to a stripe (e.g. read or write) may require all storage devices to be activated, which increases wear (e.g. deterioration) on the devices and increases power consumption.

Disclosed herein is a scheme for cold data storage systems that employs a striped array based data protection scheme while reducing power consumption and device wear. The cold data storage scheme employs a plurality of data devices and one or more protection devices. Data storage blocks are written in sequential memory blocks on a device by device basis so that only one storage device is activated during read and write operations, which saves power consumption and wear on the remaining devices in the array. All protection blocks are written to the protection devices. At least one protection device is required, additional protection devices may protect against simultaneous failure on multiple devices. For example, depending on the data protection technology applied, two protection devices protect against simultaneous failure of any two storage devices in the array, three protection devices may protect against simultaneous failure of any three devices in array, etc. Protection blocks are written to the protection devices as part of process when writing each data block to a data device. Accordingly, protection blocks are confined to the protection devices (instead of being distributed across the all storage devices of the redundant storage array) so that the capacity of a redundant storage array can be easily expanded by adding more formatted data devices into the array. If a parity checksum based protection technology is employed, no need to update the protection blocks when introducing more formatted storage devices into a redundant storage array. Similarly, more data devices with previously stored data can be added to a redundant storage array by simply updating the protection blocks on all of protection devices without touching the data blocks on the original data devices. By employing an embodiment of the redundant storage array based cold storage scheme, only one storage device is activated during a read access, allowing the other devices to remain inactive. Generally, all storage devices of a redundant storage array need to be activated to generate protection blocks during a process writing data blocks into a selected data device. When a parity checksum based protection technology, such as RAID 5, is configured for generating protection blocks, only the selected data device and the protection devices need to be activated during data writing process while other data devices remain inactive. As such, the cold storage scheme protects storage device from failure, reduces power consumption and component wear, provide flexibility and simplicity for expansion of a cold storage system, and maintains a reasonable access time (e.g. single access read/write) for data access requests under a cold storage system environment.

FIG. 1 is a schematic diagram of an embodiment of a redundant storage array based a cold data storage network 100. Network 100 may comprise an array of striped storage devices configured to implement data protection while conserving power and wear on the devices, for example when employed for cold storage systems. Network 100 comprises a controller 101, an array of data devices 110, and one or more protection devices 160. The data devices 110 and protection devices 160 are logically associated by stripes 190.

The controller 101 may be any device configured to, receive data for storage, sort the received data into data blocks, and write the data blocks to the memory blocks on a selected data device 110. For example, the controller 101 may be a number of virtual machines (VMs) in a data center network or other network, a number of general purpose processors or an application specific integrated circuit (ASIC) on a hardware node (e.g. server) in a data center or other network, a number of general purpose processors or ASICs in a personal computer with multiple storage disks, etc. For purposes of clarity of explanation, the memory blocks are depicted as sequential memory blocks A1-A4, B1-B4, and C1-C4 on data devices. A data block is a sequential grouping of bits of a predefined size taken from a data flow. The controller 101 is further configured to generate protection blocks to protect the data blocks from failures and write the protection blocks to the protection devices 160. For purposes of clarity of explanation, the protection blocks are depicted as memory blocks P1-P4 and Q1-Q4. A protection block is any data usable to reconstruct one or more storage blocks in the same common stripe 190. For example, a protection block may be generated based on parity checksum, known as a parity block. A parity block is a group of parity bits in a stripe 190 that indicate whether the sum of corresponding data bits in the same stripe 190 is odd or even. In the event of a device failure, a damaged data block can be reconstructed by determining the data block that should be summed to the retained data blocks to reach the resulting bits contained in the parity block. Parity blocks may be generated based on an exclusive or (XOR) function or an exclusive nor (XNOR) function. Alternatively, protection blocks may comprise polynomial based error correction codes, such as Reed-Solomon codes.

When the protection blocks are generated by Reed-Solomon codes, any number of data devices (k) in a stripe 190 can be protected against any number of simultaneous device failures (r) by employing a total number of data devices 110 and protection devices 160 equal to k+r where k>0 and r>0. Network 100 comprises an array of k data devices 110 and r protection devices 160, where k is any positive integer desired and r is any positive integer of device failures to be protected against. For example, one protection device 160 is employed to allow data reconstruction after any single storage device 110/160 failure, two protection devices 160 are employed to allow data reconstruction after any two simultaneous storage devices 110/160 failures, etc. Data devices 110 and protection devices 160 may be any storage devices configured to store data in a cold storage system. The storage devices 110 and 160 may be hard disk drives (HDDs), solid state drives (SSDs), flash memory, compact discs (CDs), digital video discs (DVDs), BLU-RAY discs, or any other type of memory suitable for long term storage. Storage devices 110 and 160 are address based memory locations that can be written to, read from, searched, indexed, updated, and otherwise employed for memory storage purposes. It is recommended to use rewritable media for the protection devices. If non-rewritable media, such as DVDs, Blue-ray discs, is used for protection devices, the protection blocks should not be generated until data written to all data devices is completed. The data devices 110 and protection devices 160 may be a group of physical discs or a plurality of virtualized cloud drives. A stripe 190 is grouping of one storage memory block on each storage device across over the storage devices 110 and 160.

The redundant storage array based cold data storage network 100 may be considered a RAID like array (e.g. storage devices 110 and 160 may be referred to as RAID disks). A RAID network may distribute sequential data blocks and associated protection blocks across a single stripe traversing all devices before proceeding to the next stripe. Unlike a RAID network, controller 101 writes data blocks sequentially to a single selected data device 110 until the current data device 110 is full before moving to the next data device 110. For example, data blocks are stored sequentially to memory block A1-A4 in a first data device 110 until it is full. Then, the data blocks are stored sequentially to memory block B1-B4 in a second data device 110, and then to the memory blocks C1-C4 in a third data device 110, etc. Depending on the embodiment, the protection blocks in protection devices 160 are updated after a plurality of storage blocks are written to data devices 110. The protection blocks on each protection device 160 are generated according to the data blocks within each stripe 190, but the data blocks in each stripe 190 are not sequentially related and may not be part of the same data flow, read/write access, etc. For example, storage blocks A1, B1, and C1 are stored as part of the same stripe 190, but are not sequential and may not be related. By storing data blocks in sequential memory blocks in a single data device 110 and by confining all of the protection blocks to the protection devices 160, only one data device 110 is accessed per read command. Accordingly, the rest storage devices 110/160 can remain dormant resulting in power savings and reduced component wear on the dormant storage devices. Further, in an embodiment, only one data device 110 and the protection devices 160 are accessed per write command when a parity checksum based technology is configured to generate the protection blocks. In addition, while the storage devices 110 and 160 may receive unequal wear, the storage devices 110 and 160 receive less total wear than in some RAID networks because cold storage systems leave storage devices dormant for long periods of time unlike a hot storage system which effectively accesses all disks substantially constantly. In a cold storage system, the data blocks stored in data devices are rarely modified or deleted. Therefore, the data writing to each data device 110 or protection device 160 is limited. Accordingly, network 100 may be employed to implement a RAID like striped protection scheme. As such, the redundant storage array based cold storage scheme of network 100 protects against simultaneous storage device failure, reduces power consumption and component wear, supports flexible storage protection expansion, and maintains a reasonable access time.

Figure 2:
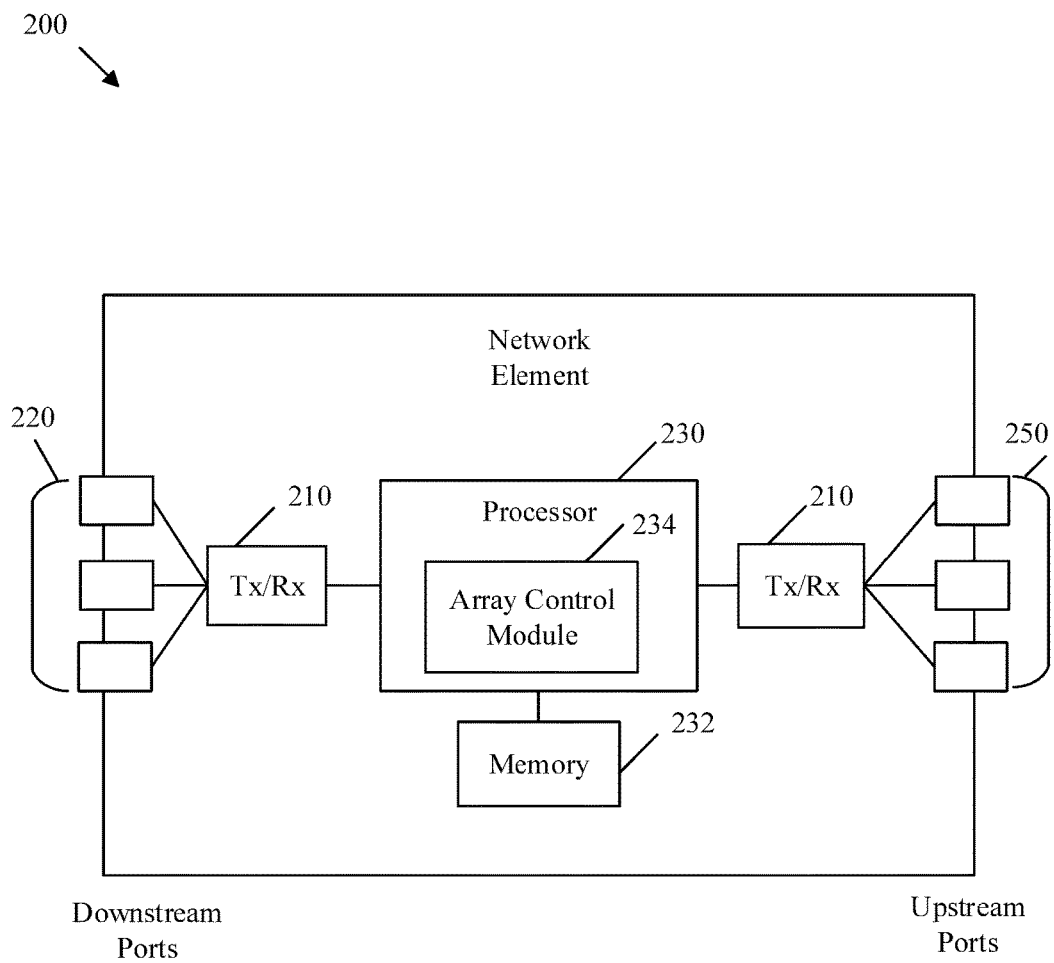
FIG. 2 is a schematic diagram of an embodiment of a network element (NE) configured to perform cold data storage functionality.

FIG. 2 is a schematic diagram of an embodiment of an NE 200 acting as a node in a network, such as a controller 101 in network 100. In some embodiments, NE 200 may comprise and control a set of redundant storage arrays, each of which comprises a plurality of storage devices such as data devices 110 and protection devices 160. NE 200 may be implemented in a single node or the functionality of NE 200 may be implemented in a plurality of nodes in a network. One skilled in the art will recognize that the term NE encompasses a broad range of devices of which NE 200 is merely an example. NE 200 is included for purposes of clarity of discussion, but is in no way meant to limit the application of the present disclosure to a particular NE embodiment or class of NE embodiments. At least some of the features/methods described in the disclosure may be implemented in a network apparatus or component such as an NE 200. For instance, the features/methods in the disclosure may be implemented using hardware, firmware, and/or software installed to run on hardware. The NE 200 may be any device that processes, reads, updates, stores, and/or forwards data frames/flows through a network, e.g. a server, a client, a network controller, etc. As shown in FIG. 2, the NE 200 may comprise transceivers (Tx/Rx) 210, which may be transmitters, receivers, or combinations thereof. Tx/Rxs 210 may be coupled to a plurality of ports 220 and 250 (e.g. upstream interfaces and/or downstream interfaces) for transmitting and/or receiving frames from other nodes. A processor 230 may be coupled to the Tx/Rxs 210 to process the frames and/or determine which nodes to send frames to. The processor 230 may comprise one or more multi-core processors and/or memory devices 232, which may function as data stores, buffers, etc. As such, NE 200 may store data in internal memory devices 232 or forward such data to external disks, depending on the embodiment. Processor 230 may be implemented as a general processor or may be part of one or more ASICs and/or digital signal processors (DSPs). Processor 230 may comprise an Array Control Module 234, which may perform methods 300, 400, 500, and/or 600, depending on the embodiment. In an alternative embodiment, Array Control Module 234 may be implemented as instructions stored in memory 232, which may be executed by processor 230, for example as a computer program product stored in a non-transitory medium. In another alternative embodiment, the Array Control Module 234 may be implemented on separate NEs. The ports 220 and 250 may contain electrical and/or optical transmitting and/or receiving components. For example, the Array Control Module 234 may control a plurality of external disks (e.g. cloud drives), such as storage disks 110 and/or protection disks 160 via transmissions through Tx/Rxs 210 and/or ports 220 and 250.

It is understood that by programming and/or loading executable instructions onto the NE 200, at least one of the processor 230, Array Control Module 234, ports 220 and 250, Tx/Rxs 210, and/or memory 232 are changed, transforming the NE 200 in part into a particular machine or apparatus, e.g., a multi-core forwarding architecture, having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an ASIC, because for large production runs the hardware implementation may be less expensive than the software implementation. Often a design may be developed and tested in a software form and later transformed, by well-known design rules, to an equivalent hardware implementation in an application specific integrated circuit that hard-wires the instructions of the software. In the same manner as a machine controlled by a new ASIC is a particular machine or apparatus, likewise a computer that has been programmed and/or loaded with executable instructions may be viewed as a particular machine or apparatus.

Figure 3:
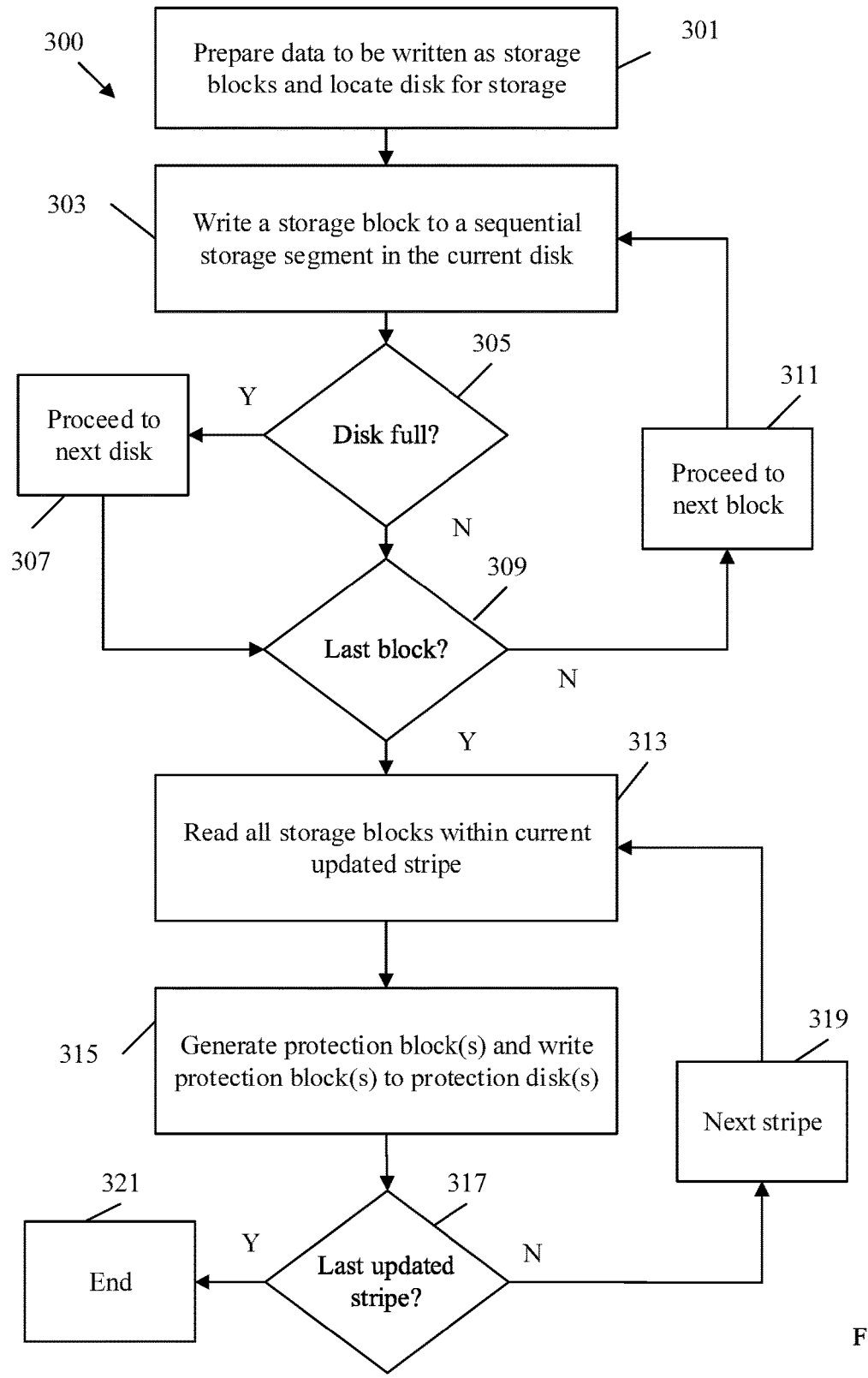
FIG. 3 is a flowchart of an embodiment of a method of data writing in a cold data storage network.

FIG. 3 is a flowchart of an embodiment of a method 300 of data writing in a cold data storage network, such as network 100. Method 300 may be implemented by a controller 101, data devices 110, protection devices 160, and/or NE 200. Method 300 is initiated when a controller receives a data flow to be written to the cold storage network. At step 301, data from the data flow is prepared to be written as a set of data blocks. For example, the data is grouped into blocks of predefined length, indexed for later searchability, etc. A data device 110 is also selected (e.g. current disk) to provide a storage location for the data blocks. Steps 303, 305, 307, 309, and 311 iteratively write data blocks to sequential memory blocks in the selected data device 110 until the data blocks prepared in step 301 is completely stored. At step 303, a data block is written to a sequential memory block in the current data device 110. After the current data block is written, the method 300 proceeds to step 305 to determine if the data device is full after writing the current data block at step 303. If the data device 110 is full, the method 300 proceeds to step 307 and proceeds to the next data device 110 before proceeding to step 309. If the data device is not full, the method 300 proceeds directly to step 309. At step 309, the method determines whether the current data block written at step 303 is the last data block to be written. If more data blocks are to be written, the method proceeds to step 311 and proceeds to the next sequential memory block to be written before returning to step 303 to continue writing data blocks to sequential memory blocks on the current data device 110. Accordingly, by employing steps 303, 305, 307, 309, and 311 the sequential data blocks are written to a plurality of sequential memory blocks on a common data device 110, such that the data blocks written to memory blocks are independent from the stripes across over all storage devices in the same redundant storage array. For a serial of data blocks, no data blocks are written to an alternate data device 110 until the current data device 110 is filled. In other words, storage blocks are written on a device by device basis and not on a stripe by stripe basis.

If the current data block is the last block to be written at step 309, the method 300 proceeds to step 313. Steps 313, 315, 317, and 319 are employed to generate protection blocks and write the generated blocks to the protection devices for all stripes updated during steps 303, 305, 307, 309, and 311. At step 313, all storage blocks are read across all data devices for the current updated stripe. At step 315, one or more protection blocks (e.g. one protection block for each protection device) are generated for the current stripe. Such protection block(s) are written to the corresponding protection device(s) 160. At step 317, the method 300 determines whether the current stripe is the last updated stripe. If the current stripe is the last updated stripe, the method 300 proceeds to step 321 and ends. If the current stripe is not the last updated stripe, the method 300 proceeds to step 319 and continues to the next updated stripe before returning to step 313. Method 300 requires only that one currently selected data device 110 is activated during the data storage phase of steps 303, 305, 307, 309, and 311. Once a current data device 110 is filled, the current data device 110 can be deactivated and the next data device 110 is activated. Further, only the currently selected data device 110 must be active during a corresponding read method as discussed below. However, all storage devices (e.g. data devices 110 and protection devices 160) are activated during the protection block generation phase of steps 313, 315, 317, and 319. Method 300 is a generic data protection solution, which can be applied with almost all data protection technologies, such as parity checksum or Reed-Solomon codes.

Figure 4:
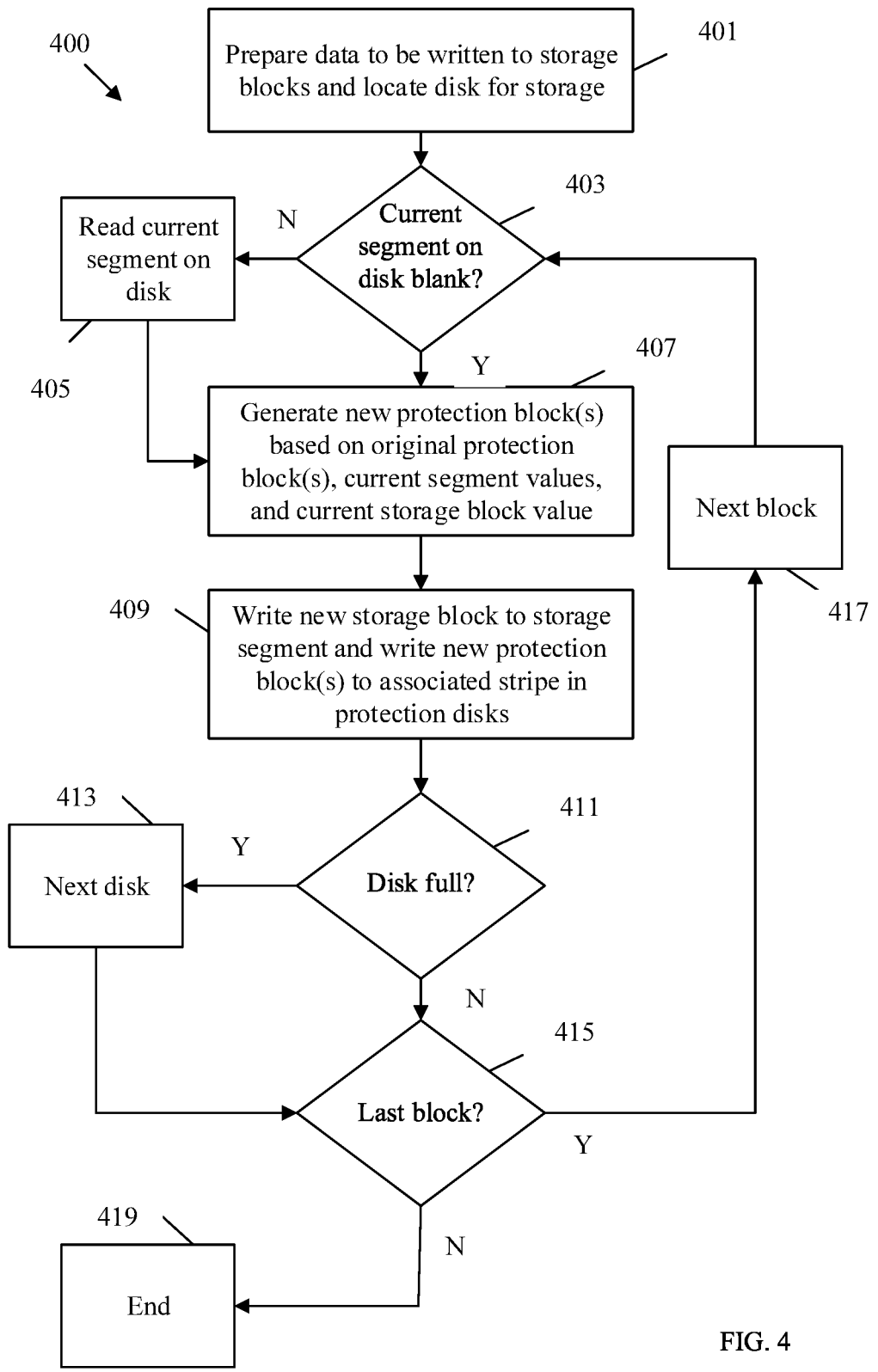
FIG. 4 is a flowchart of an embodiment of an optimized method of data writing in a cold data storage network when a parity checksum based data protection technology is applied.

FIG. 4 is a flowchart of an embodiment of an optimized method 400 of data writing in a cold data storage network, such as network 100, when a parity checksum based data protection technology is applied. Method 400 is recommended to be employed with parity checksum based data protection technology, RAID 5 like data protection technology. Method 400 may be implemented by a controller 101, data devices 110, one protection device 160, and/or NE 200. Method 400 is initiated when a controller receives a data flow to be written to cold storage. Method 400 is substantially similar to method 300 but writes data blocks and protection blocks substantially in parallel to prevent the need to store and then re-read data blocks across all stripes for protection block generation. Step 401 is substantially similar to step 301. At step 403, the method 400 determines whether the memory block allocated for writing the current data block is blank. If the memory block is not blank, the method 400 proceeds to step 405 to read the original data block from the memory block and proceeds to step 407. If the memory block is blank, the method 400 proceeds directly to step 407. At step 407, a protection block is generated for the corresponding stripe on the protection device 160. A protection block is updated by applying the bit difference between the current values of the data block and the original values in the current memory block, as read at step 405, to the original values of the protection block. Specifically, the existing values of a protection block are impacted by the bit difference between the current values of the data block and the original values of the data block on the data device 110. For example, a change in a bit in a data block would require a corresponding bit to be changed in the corresponding protection block. As such, other data devices may remain inactive during data writing process. At step 409, the data block prepared at step 401 is written over the values at the current memory block on the selected data device and the corresponding protection block generated at step 407 is written to the protection block in the same stripe of the protection device. At step 411, the method determines whether the current data device is full. If the data device is not full, the method 400 proceeds to step 415. Otherwise, the method 400 proceeds to the next data device at step 413 before continuing to step 415. At step 415, the method 400 determines whether the data block written at step 409 is the last data block to be written. If no more data blocks are to be written, the method 400 proceeds to step 419 and ends. Otherwise, the method 400 proceeds to step 417 and move to the next data block to be written before returning to step 403. Like method 300, the sequential data blocks are written sequentially to the currently selected data device so that data blocks are written on a device by device basis and not on a stripe by stripe basis. Method 400 requires only that the currently selected data device and the protection device are activated during data block writing process so that the non-selected data devices are not activated. Further, only the currently selected data device must be activated during a corresponding read method, as discussed below, such that all other storage devices are not activated. For method 400, the protection device may employ parity checksum based data protection technology, but may not be applicable with Reed-Solomon codes.

Figure 5:
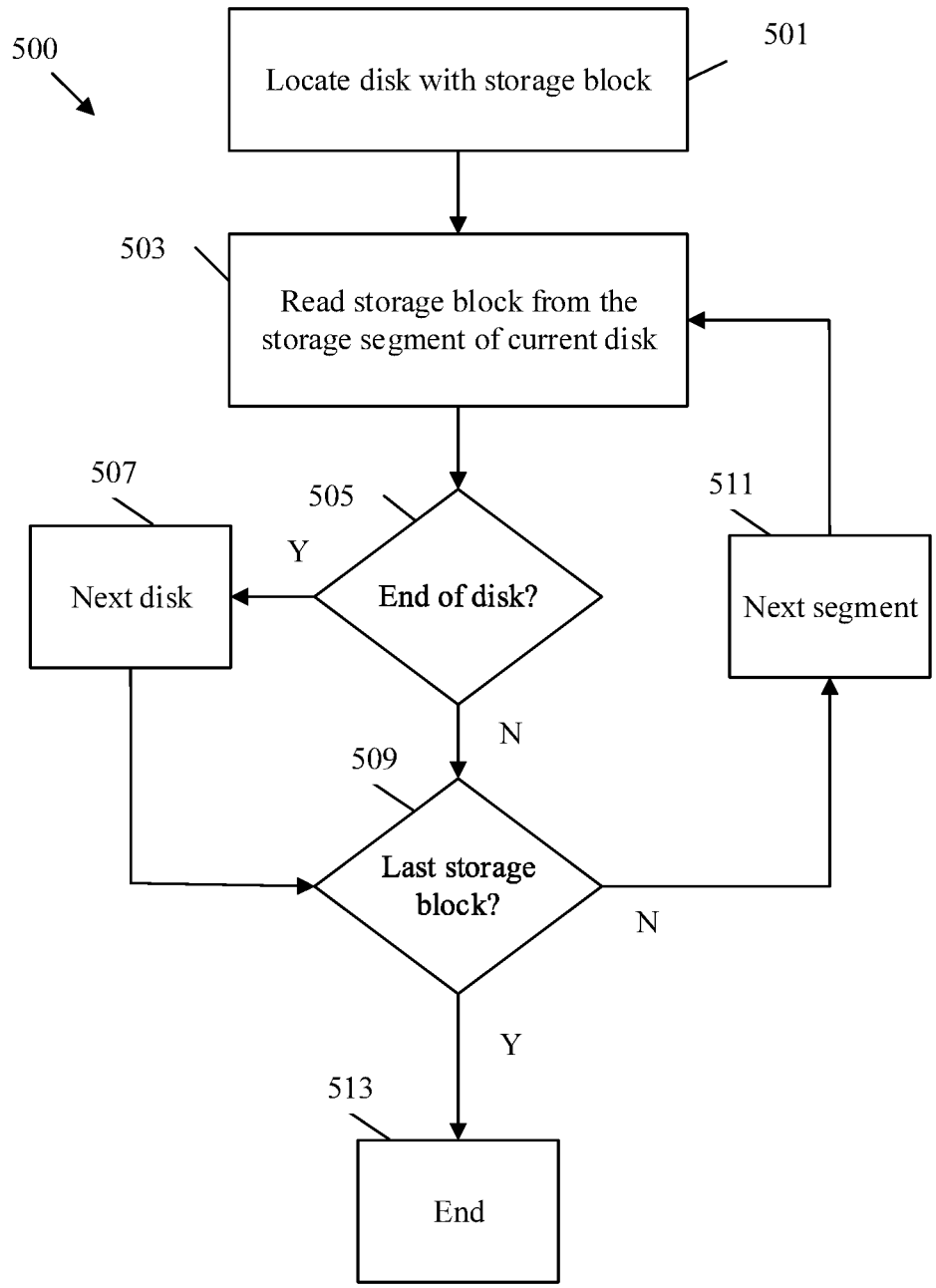
FIG. 5 is a flowchart of an embodiment of a method of data reading in a cold data storage network.

FIG. 5 is a flowchart of an embodiment of a method 500 of data reading in a cold storage network, such as network 100. Method 500 may be implemented by a controller 101, data devices 110, protection devices 160, and/or NE 200. Method 500 is initiated when a controller determines to read data blocks from a data device in a redundant storage array. At step 501, the first data block to be read on a data device is located, for example based on an index search, or an node table. At step 503, a current data block is read from of the located data device before proceeding to step 505. If the end of the data device has been reached at step 505, the method 500 proceeds to step 507 and moves to the next data device before continuing to step 509. If the end of the data device has not been reached at step 505, the method proceeds directly to step 509. At step 509, the method 500 determines whether the last desired data block has been read. If the current data block is the last data block to be read, the method 500 proceeds to step 513 and ends. If the current data block is not the last data block to be read, the method 500 proceeds to step 511, selects the next data block, and returns to step 503. By employing method 500, a redundant storage array based system written according to methods 300 or 400 can be read by activating a single data device without activating all other storage devices, which may result in significant savings in power consumption and component wear.

Figure 6:
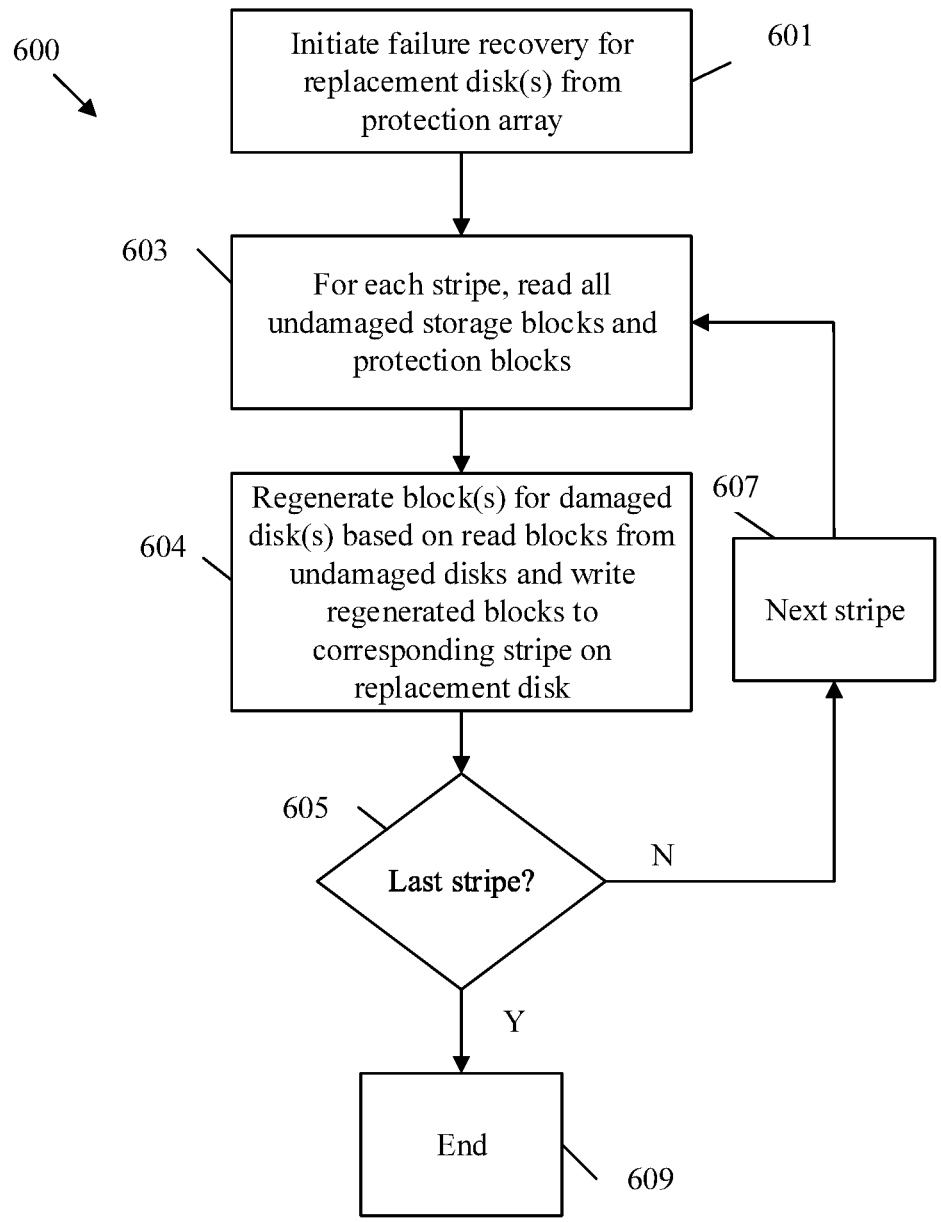
FIG. 6 is a flowchart of an embodiment of a method of data recovery in a cold data storage network.

FIG. 6 is a flowchart of an embodiment of a method 600 of data recovery in a cold storage network, such as network 100. Method 600 may be implemented by a controller 101, data devices 110, protection devices 160, and/or NE 200. Method 600 is initiated when one or more storage devices in a redundant storage array fail. For example, one or more failed storage devices may be replaced (e.g. by a technician) by functioning empty storage devices. At step 601, failure recovery is initiated for the replacement device(s) from the first stripe in the redundant storage array. At step 603, all data blocks and protection blocks are read for the current stripe from the undamaged storage devices. At step 604, one missing block on a damaged device is regenerated based on the data values read in step 603. Each regenerated block is then written to the corresponding memory block in the same stripe on the each replacement storage device before proceeding to step 605. If the current stripe is the last stripe in the redundant storage array, the method 600 proceeds to step 609 and ends. If the current stripe is not the last stripe in the redundant storage array, the method 600 proceeds to step 607, moves to the next stripe, and returns to step 603. As shown by method 600, the damaged storage devices in a redundant storage array such as network 100 can be recovered in case of storage device failure without loss of data. The maximum number of recoverable storage devices depends on the data protection technology employed on the cold storage system.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A data storage apparatus comprising:
 a striped redundant storage array comprising:
  a plurality of data devices configured to store data blocks in a plurality of memory blocks on the data devices; and
  one or more protection devices configured to store protection blocks in a plurality of memory blocks on protection devices, wherein the data devices and the protection devices are associated by a plurality of stripes, wherein each stripe comprises a single memory block on each data device and a single memory block on each protection device, and wherein each protection block in a corresponding protection device comprises a value for reconstructing damaged blocks within the same stripe; and
 a controller coupled to the striped redundant storage array, the controller configured to:
  select a data device for data read or write access;
  store a set of data blocks sequentially in memory blocks in the selected data device over a plurality of stripes; and
  generate a set of protection blocks based on the values of the data blocks for each updated stripe;
  store the generated protection blocks to the corresponding memory blocks of the stripe in the protection devices;
  read data blocks sequentially from the selected data device;
  reconstruct data blocks for one or more damaged data devices and store the data blocks on the replacement storage devices.

2. The data storage apparatus of claim 1, wherein storing a set of data blocks sequentially to memory blocks in the selected data devices comprises activating the selected data device without activating any of the other storage devices.

3. The data storage apparatus of claim 1, wherein the controller is further configured to read data blocks sequentially from the selected data device without activating any of the other storage devices as part of a single data reading access.

4. The data storage apparatus of claim 1, wherein storing a set of data blocks sequentially to memory blocks in the selected data device comprises writing to a plurality of data blocks in a single data device, and storing a plurality of protection blocks in the protection devices for each updated stripe.

5. The data storage apparatus of claim 4, wherein storing the set of protection blocks in the protection devices with all storage devices activated comprises:
   reading data blocks across the data devices for each stripe corresponding to a stored data block;
   generating protection blocks based on the values of the obtained data blocks; and
   storing the protection blocks to the memory blocks in the protection devices according to the stripe.

6. The data storage apparatus of claim 1, wherein storing the set of protection blocks in the protection devices comprises storing a protection block in the protection device after each data block is stored. Only one protection device is required for a redundant storage array if a parity checksum based data protection technology is configured. Only the selected data device and the protection device need to be activated while all other data devices remain inactive.

7. The data storage apparatus of claim 6, wherein storing the protection blocks further comprises:
   generating a new parity protection block for each updated stripe by applying the bit difference between the current data block to be stored and the original data block in the data device to the original protection block in the protection device; and storing the new protection block over the memory block in the protection device.

8. The data storage apparatus of claim 1, wherein the striped redundant storage array is configured to protect against a single storage device failure, and wherein the one or more protection devices comprises at least a single protection device.

9. The data storage apparatus of claim 1, wherein the striped redundant storage array is configured to protect against two simultaneous storage device failures, and wherein the one or more protection devices comprises at least two protection devices.

10. The data storage apparatus of claim 1, wherein the generated protection block comprises Reed-Solomon codes, or other data protection technologies.

11. A method of data storage comprising:
   writing, based on instructions from a controller, data blocks sequentially to a plurality of memory blocks in a selected data device, wherein the selected data device is part of a striped redundant storage array comprising a plurality of data devices and one or more protection devices, wherein the data devices and the protection devices are associated by a plurality of stripes, and wherein each stripe comprises a single memory block on each storage device;
   generating a set of protection blocks, wherein each protection block value is generated based on values of all data blocks in each updated stripe; and
   storing a protection block to a memory block in each protection device for each stripe updated when writing data blocks, wherein each protection block comprises a value for reconstructing damaged storage blocks in the same stripe read data blocks sequentially from the selected data device; and
   reconstruct data blocks for one or more damaged data devices and store the data blocks in the replacement storage devices.

12. The method of claim 11, wherein writing the data blocks sequentially to memory blocks in the single selected data device comprises activating the selected data device without activating any other of the plurality of data devices.

13. The method of claim 11, further comprising reading the data blocks sequentially from the single selected data device without activating any other storage devices as part of a single data reading access.

14. The method of claim 11, wherein writing the data blocks sequentially in the single selected data device comprises writing the data blocks to a plurality of memory blocks in the data device before storing the protection blocks in the protection devices.

15. The method of claim 11, wherein storing the protection blocks in the protection devices for each updated stripe comprises storing protection blocks after a data block is stored in the selected data device.

16. The method of claim 11, wherein storing the protection blocks in the protection devices comprises storing r protection blocks across r protection devices where r, any integer greater than zero, is the number of configured protection devices of each redundant storage array.

17. A non-transitory computer readable medium comprising a computer program product for use by a controller coupled to an array of data storage devices and one or more protection devices, the computer program product comprising computer executable instructions stored on the non-transitory computer readable medium such that when executed by a processor cause the controller to:
   write data blocks sequentially to a plurality of memory blocks in a single selected data device in the array, wherein the data devices and the protection devices are associated by a plurality of stripes, and wherein each stripe comprises a single memory block on each data device and each protection device;
   generate a set of protection blocks, wherein each protection block value is based on values of the data blocks in the corresponding stripe; and
   store a protection block to a memory block in each protection device for each stripe updated when writing data blocks, wherein each protection block comprises a value for reconstructing damaged storage blocks in the same stripe.

18. The computer program product of claim 17, wherein writing the data blocks to the sequential memory blocks in a single selected data device comprises activating the single selected data device without activating any of the other storage devices in the array.

19. The computer program product of claim 17, wherein the instructions further cause the controller to read data blocks from a single selected data device without activating any other storage devices in the array as part of a single data access.

20. The computer program product of claim 17, wherein storing the protection block for each updated stripe comprises storing a protection block in each protection device after each data block is written in the same stripe.

* * * * *